(12) United States Patent
Zhu et al.

(10) Patent No.: US 10,263,614 B2
(45) Date of Patent: *Apr. 16, 2019

(54) SYSTEMS AND METHODS TO SWITCH RADIO FREQUENCY SIGNALS FOR GREATER ISOLATION

(71) Applicant: Skyworks Solutions, Inc., Woburn, MA (US)

(72) Inventors: Yu Zhu, Wellesley, MA (US); Oleksiy Klimashov, Burlington, MA (US); Dylan Charles Bartle, Arlington, MA (US)

(73) Assignee: Skyworks Solutons, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/970,527

(22) Filed: May 3, 2018

(65) Prior Publication Data

US 2018/0323778 A1 Nov. 8, 2018

Related U.S. Application Data

(60) Continuation of application No. 15/585,520, filed on May 3, 2017, now Pat. No. 9,991,885, which is a division of application No. 14/694,824, filed on Apr. 23, 2015, now Pat. No. 9,674,006.

(60) Provisional application No. 62/039,724, filed on Aug. 20, 2014.

(51) Int. Cl.
*H04B 1/44* (2006.01)
*H03K 17/16* (2006.01)
*H04L 25/02* (2006.01)
*H03K 19/00* (2006.01)
*H03K 17/693* (2006.01)
*H03K 17/06* (2006.01)
*H04B 1/3827* (2015.01)

(52) U.S. Cl.
CPC ......... *H03K 17/162* (2013.01); *H03K 17/693* (2013.01); *H03K 19/00* (2013.01); *H04L 25/0266* (2013.01); *H03K 2017/066* (2013.01); *H04B 1/3827* (2013.01); *H04B 1/44* (2013.01)

(58) Field of Classification Search
CPC .... H03K 17/693; H03K 17/162; H03K 19/00; H03K 17/063; H03K 17/62; H03K 17/002; H04B 1/44; H04B 7/0602; H04B 7/0817; H04B 1/18; H04L 25/0266
See application file for complete search history.

(56) References Cited

U.S. PATENT DOCUMENTS

| 5,777,530 | A | 7/1998 | Nakatuka |
| 7,446,590 | B2 | 11/2008 | Chung |
| 9,118,398 | B1 | 8/2015 | Han |
| 9,674,006 | B2 | 6/2017 | Zhu et al. |
| 2007/0058309 | A1 | 3/2007 | Tayrani et al. |
| 2008/0233744 | A1 | 9/2008 | Kaul |
| 2009/0146724 | A1 | 6/2009 | Mun |

(Continued)

*Primary Examiner* — Nhan T Le
(74) *Attorney, Agent, or Firm* — Knobbe, Martens, Olson & Bear, LLP (57) ABSTRACT

In semiconductor switches, the isolation can be limited by the capacitive coupling between the switch input and the switch output. Ultra-high isolation can be achieved by adding a coupled transmission line to the semiconductor switch. The coupled transmission line introduces inductive coupling, which cancels at least a part of the capacitive coupling between the switch input and the switch output.

20 Claims, 10 Drawing Sheets

(56) References Cited

U.S. PATENT DOCUMENTS

2011/0294443 A1  12/2011  Nohra et al.
2012/0274414 A1  11/2012  Hung et al.
2013/0169333 A1   7/2013  Oshima
2014/0009205 A1   1/2014  Madan

SYSTEMS AND METHODS TO SWITCH RADIO FREQUENCY SIGNALS FOR GREATER ISOLATION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field of the Invention

The present invention is generally in the field of semiconductors, and more particularly, to semiconductor switches.

Description of the Related Art

In semiconductor switches, the isolation is limited by the capacitive coupling between the switch input and the switch output. The isolation can be improved by increasing the number of semiconductor devices in series and by reducing the semiconductor device size. However, this increases the insertion loss.

SUMMARY

Ultra-high isolation in semiconductor switches can be achieved by adding a coupled transmission line to the semiconductor switch. The coupled transmission line introduces inductive coupling, which cancels at least a part of the capacitive coupling between the switch input and the switch output.

According to a number of embodiment, the disclosure relates to a switching circuit comprising a coupled transmission line including a first transmission line and a second transmission line, and a plurality of transistors forming a switch and configured to switch an input signal from a first port to a second port through the first transmission line and to disconnect the first port from a third port, where the second transmission line induces an inductive signal which cancels at least a portion of a capacitive signal generated by the input signal capacitively coupling through the switch to the third port.

In an embodiment, the plurality of transistors include a first and a second transistor electrically connected in series and having a common terminal, a first terminal, and a second terminal, where the common terminal is electrically connected to the first port, the first terminal is electrically connected to the second port through the first transmission line, and the second terminal is electrically connected to the third port through the second transmission line.

In another embodiment, the switching circuit further comprises a third transistor electrically connected to the first terminal and a fourth transistor electrically connected to the second terminal. In a further embodiment, the first, second, third and fourth transistors include field-effect transistors (FETs). In a yet further embodiment, at least one of the plurality of transistors includes four transistor devices electrically connected in series. In another embodiment, the first port is electrically connected to a radio frequency (RF) antenna, the second port is configured to receive an RF receive signal, and the third port is configured to receive an RF transmit signal. In another embodiment, the switch includes a single pole double throw (SPDT) switch.

Certain embodiments relate to a method to improve isolation of a switching circuit. The method comprises receiving a radio frequency (RF) signal at a first port in a switching circuit, switching the switching circuit so as to electrically connect the first port to a second port in the switching circuit and to electrically disconnect the first port from a third port in the switching circuit, and conducting the RF signal from the first port to the second port through a first transmission line of a coupled transmission line.

In an embodiment, the method further comprises inducing an inductive signal in a second transmission line of the coupled transmission line approximately equal in magnitude and approximately opposite in phase from a capacitive signal generated by capacitive coupling of the RF signal through the switching circuit to the third port. In another embodiment, the inductive signal cancels at least a portion of the capacitive signal to provide isolation improvement.

In an embodiment, the method further comprises generating a capacitive signal by capacitive coupling of the RF signal through the switching circuit to the third port. In another embodiment, the method further comprises inducing an inductive signal in a second transmission line of the coupled transmission line, wherein the inductive signal cancels at least a portion of the capacitive signal to provide isolation improvement.

In a further embodiment, the switching circuit includes a single pole double throw (SPDT) switch, where the SPDT switch includes a first and a second transistor electrically connected in series and having a common terminal, a first terminal, and a second terminal, such that the common terminal is electrically connected to the first port, the first terminal is electrically connected to the second port through the first transmission line, and the second terminal is electrically connected to the third port through the second transmission line.

According to a number of embodiments, the disclosure relates to a switching circuit implemented in a semiconductor die. The switching circuit comprises a first and a second transistor electrically connected in series and having a common terminal, a first terminal, and a second terminal, and a coupled transmission line including a first transmission line and a second transmission line, where the first terminal is electrically connected to a first port through the first transmission line, the second terminal is electrically connected to a second port through the second transmission line, and the common terminal is electrically connected to a third port. In an embodiment, the switching circuit further comprises a third transistor electrically coupled to the first terminal and a fourth transistor electrically coupled to the second terminal.

Certain other embodiments relate to a switching module comprising a switching circuit implemented in a first semiconductor die. The switching circuit includes a plurality of transistors and a coupled transmission line and is configured to switch an input signal from a first port to a second port through a first transmission line of the coupled transmission line and to disconnect the input signal from a third port, and at least one of a prefilter circuit, a post filter circuit, a power amplifier circuit, a switch circuit, a down converter circuit, and a modulator circuit implemented in a second semiconductor die.

In an embodiment, a capacitive signal is generated by capacitive coupling of the input signal through the switching circuit to the third port. In another embodiment, an inductive signal induced in a second transmission line of the coupled transmission line cancels at least a portion of the capacitive signal to provide better isolation.

According to other embodiment, the disclosure relates to a portable transceiver comprising an antenna configured to receive a radio frequency (RF) input signal and to transmit an RF output signal, a transmitter configured to provide the antenna with the RF output signal, a receiver configured to amplify the received RF input signal, and a switch including a plurality of transistors and a coupled transmission line and configured to electrically couple the antenna to the transmitter through a first transmission line of the coupled transmission line and electrically couple the antenna to the receiver through a second transmission line of the coupled transmission line.

In an embodiment, the switch is switched to electrically couple the antenna to one of the transmitter and the receiver and to electrically disconnect the antenna from the other of the transmitter and the receiver. In another embodiment, a signal induced in the coupled transmission line cancels at least a portion of a signal generated by capacitive coupling in the switch to improve isolation of the switch. In a further embodiment, the switch includes an ultra-high isolation single pole double throw (SPDT) switch.

In a further embodiment, the plurality of transistors include a first and a second transistor electrically connected in series and having a common terminal, a first terminal, and a second terminal, where the first terminal is electrically connected to a transmit port through the first transmission line, the second terminal is electrically connected to a receive port through the second transmission line, and the common terminal is electrically connected to an antenna port. In a yet further embodiment, the plurality of transistors further include a third transistor electrically connected to the first terminal and a fourth transistor electrically connected to the second terminal. In another embodiment, the first, second, third and fourth transistors include field-effect transistors (FETs).

DETAILED DESCRIPTION

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Figure 1:
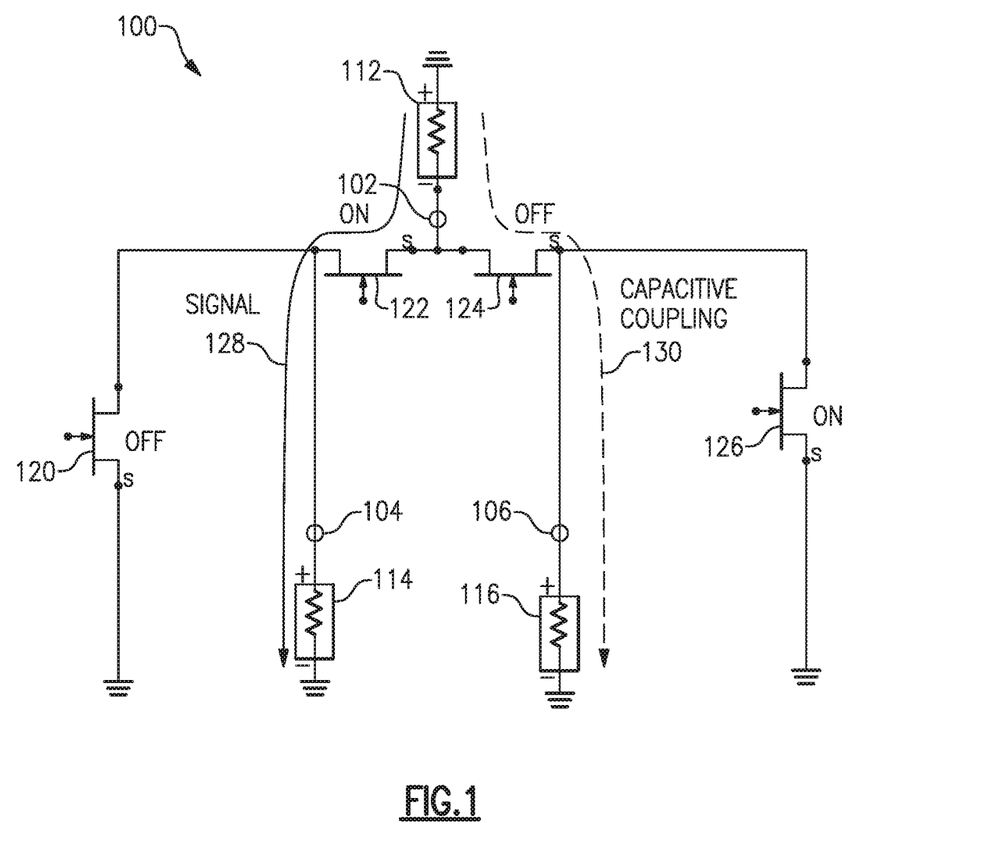
FIG. 1 is a circuit diagram of a single pole double throw (SPDT) switch configured to switch a radio frequency (RF) signal, according to certain embodiments.

FIG. 1 is a circuit diagram of a single pole double throw (SPDT) switch or switching circuit 100 that can be used to switch radio frequency (RF) signals. For example, multi-band GSM-based mobile cellular handsets generally include a number of circuits for the transmit (TX) and receive (RX) of the different bands of the handset. To select between the TX and RX modes of the various RF bands, a switching circuit is usually employed at the antenna of the handset. The function of the switching circuit is to electrically connect the antenna of the cellular handset to the TX or RX circuit of the band that is in use at a given time, and to simultaneously isolate all other sections of the handset from the antenna.

The SPDT switch 100 comprises a first transistor 120, a second transistor 122, a third transistor 124, and a fourth transistor 126. In the illustrated embodiment, transistors 120, 122, 124, and 126 comprise field-effect transistors (FETs). In other embodiments, the transistors comprise bipolar-junction transistors (BJT), heterojunction-bipolar transistors (HBT), gallium arsenide field effect transistors (GaAsFET), or other active devices.

The SPDT switch 100 further comprises a first port 102, a second port 104, and a third port 106, which are shown terminated to ground through termination loads 112, 114, and 116, respectively. In an embodiment, termination loads 112, 114, 116 each comprise approximately 50 ohms. In an embodiment, the first port 102 comprises an antenna port, the second port comprises a transmit (TX) port, and the third port comprises a receive (RX) port. In another embodiment, the first port 102 comprises an antenna port, the second port comprises a RX port, and the third port comprises a TX port.

FETs 120 and 126 are shunted to ground and are thus referred to as Shunt FETs. FETs 122 and 124 are connected in series and thus referred to as Series FETs. A source of FET 120 and a source of FET 126 electrically couple to ground. A drain of FET 120 and a drain of FET 122 electrically couple to port 104. A source of FET 122 and a drain of FET 124 electrically couple to port 102. A source of FET 124 and a drain of FET 126 electrically couple to port 106. Gates of each FET 120, 122, 124, 126 electrically couple to control signals (not shown) to open and close the FETs 120, 122, 124, 126 to control the operation of the switch 100. Based on the control signals (not shown), the switch 100 can be configured to switch the signal 128 between port 102 and port 104 or between port 102 and port 106. As illustrated in FIG. 1, the switch 100 is configured to switch a signal 128 from port 102 to port 104 such that port 104 is electrically connected to port 102 (ON) and port 106 is disconnected from port 102 (OFF).

However, as illustrated by dashed line 130, at least a portion of the signal 128 flows from port 102 to port 106 even though the switch between port 102 and port 106 is open or OFF. This is due to capacitive coupling through the switch 100 between the port 102 and the port 106. Isolation can be defined as the magnitude of a signal coupled across an open circuit. The isolation of the switch 100 is limited by the cross-coupling or capacitive coupling ($C_{off}$) between the input and the output of the switch 100 and can be improved by reducing $C_{off}$. Another measure of the performance of a circuit is insertion loss, which is the loss of signal power when the switching circuit is closed or ON.

Figure 2:
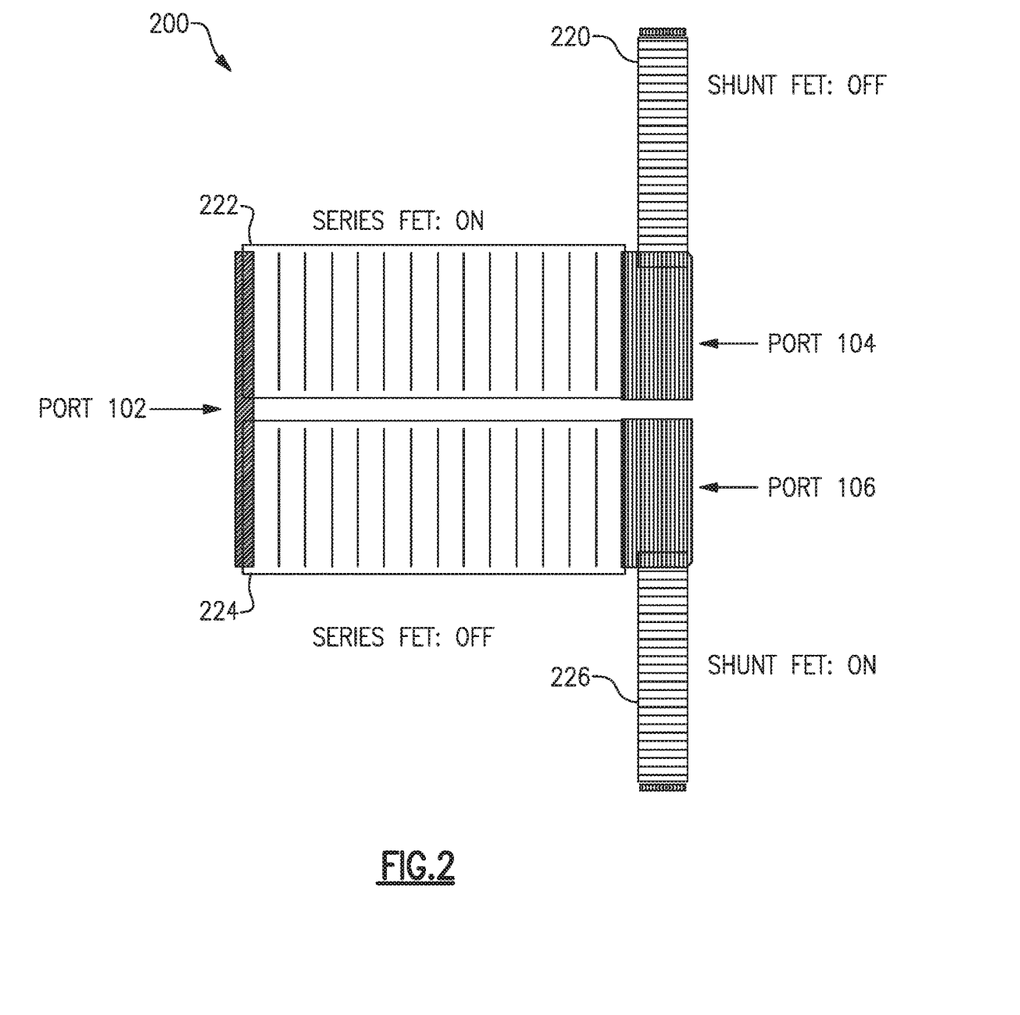
FIG. 2 is a layout schematic of the SPDT switch of FIG. 1, according to certain embodiments.

FIG. 2 is a layout schematic of a SPDT switch 200 comprising a first FET 220, a second FET 222, a third FET 224, a fourth FET 226 and ports 102, 104, 106. In an embodiment, the switch 200 comprises the circuit of the SPDT switch 100, where FETs 222, 224 comprise Series FETs and FETs 220, 226 comprise Shunt FETs. In the illustrated embodiment of FIG. 2, each FET 220, 222, 224, 226 comprises a plurality of transistors or transistor devices connected in series, as is known to one of skill in the art from the description herein. In an embodiment, the Series FETs 222, 224 each comprise a 174×23μ×14 FET having a finger number of 174, a unit finger width of approximately 23 microns, and 14 transistor devices electrically coupled in series. In an embodiment, the Shunt FETs 220, 226 each comprise a 54×11.1μ×14 FET having a finger number of 54, a unit finger width of approximately 11.1 microns, and 14 transistor devices electrically coupled in series.

In some instances, the isolation of the switch 200 can be improved or increased by increasing the number of transistors in series and by reducing the device size of each of the transistors in series. However, reducing the device size can also increase the insertion loss of the switch 200.

Figure 3:
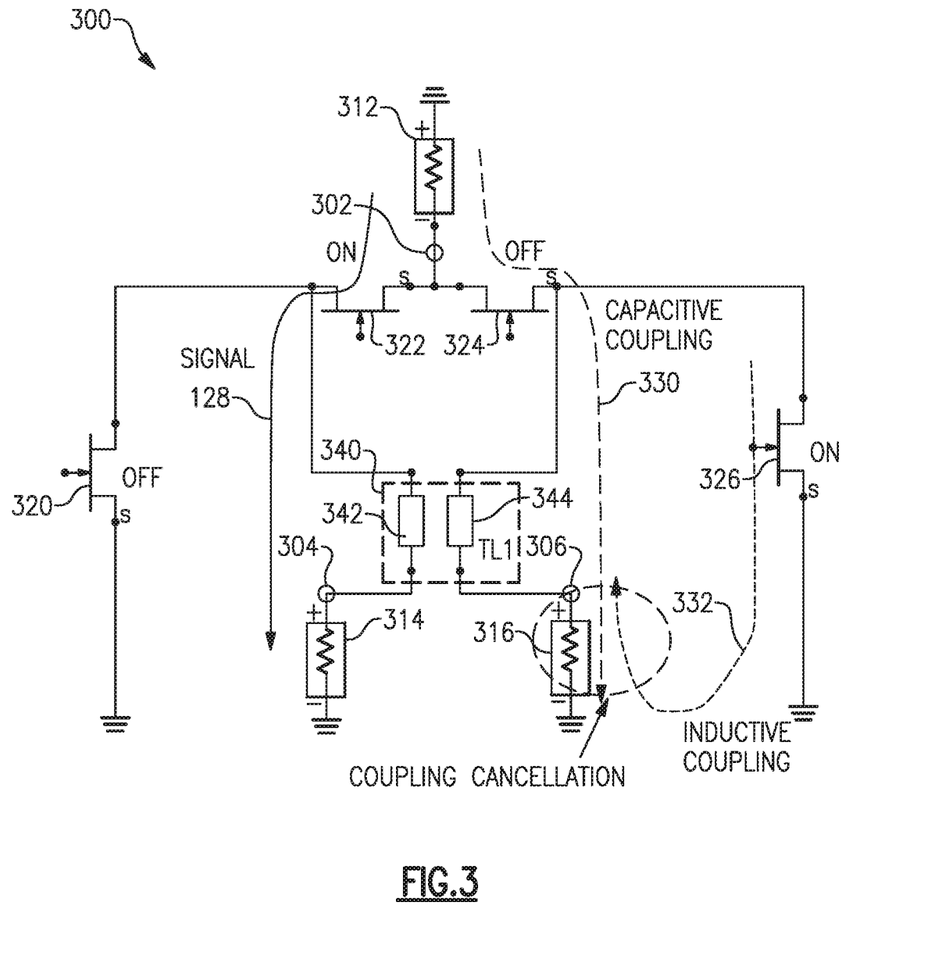
FIG. 3 is a circuit diagram of a SPDT switch including inductive coupling and configured to switch an RF signal, according to certain embodiments.

In an embodiment, high isolation can be achieved by connecting the SPDT switch 100, 200 to a coupled transmission line. In an embodiment, the coupled transmission line functions as a mutual inductor. FIG. 3 is a circuit diagram of an embodiment of a SPDT switch 300 including inductive coupling. The SPDT switch 300 comprises a first transistor 320, a second transistor 322, a third transistor 324, and a fourth transistor 326. In the illustrated embodiment, transistors 320, 322, 324, and 326 comprise field-effect transistors (FETs). In other embodiments, the transistors comprise bipolar-junction transistors (BJT), heterojunction-bipolar transistors (HBT), gallium arsenide field effect transistors (GaAsFET), or other active devices.

The SPDT switch 300 further comprises a first port 302, a second port 304, and a third port 306, which are shown as being terminated to ground through termination loads 312, 314, and 316, respectively. In an embodiment, the termination loads 312, 314, 316 each comprise approximately 50 ohms. In an embodiment, the first port 302 electrically couples to an RF antenna, the second port 304 comprises a TX port which is electrically coupled to RF transmit circuitry, and the third port 306 comprises an RX port which is electrically coupled to RF receive circuitry. In another embodiment, the first port 302 electrically couples to the RF antenna, the second port 304 comprises the RX port, and the third port 306 comprises the TX port.

The SPDT switch 300 further comprises a coupled transmission line 340 including a first transmission line 342 and a second transmission line 344. In certain embodiments, coupled transmission lines further comprise a ground, which can be a part of a backside metallization layer of a semiconductor die. In an embodiment, the first and second transmission lines 342, 344 of the coupled transmission line 340 act as inductors. Mutual inductance occurs when the change in current in one inductor induces a voltage in another nearby inductor.

FETs 320 and 326 (Shunt FETs) are shunted to ground and FETs 322 and 324 are connected in series (Series FETs). A source of FET 320 and a source of FET 326 electrically couple to ground. A drain of FET 320 and a drain of FET 322 electrically couple to port 304 through the first transmission line 342. A source of FET 322 and a drain of FET 324 electrically couple to port 302. A source of FET 324 and a drain of FET 326 electrically couple to port 306 through the second transmission line 344. Gates of each FET 320, 322, 324, 326 electrically couple to control signals (not shown) to open and close the FETs 320, 322, 324, 326 to control the operation of the switch 300. Based on the control signals (not shown) the switch 300 can be configured to switch the signal 128 between port 302 and port 304 or between port 302 and port 306. As illustrated in FIG. 1, the switch 300 is configured to switch the signal 128 from port 302 to port 304 such that port 304 is electrically connected to port 302 (ON) and port 306 is disconnected from port 302 (OFF).

As illustrated by dashed line 330, at least a portion of the signal 128 flows from port 302 to port 306 even though the switch 300 between port 302 and port 306 is OFF. The capacitive signal 330 is due to capacitive coupling ($C_{off}$) of the OFF FET 324 between the port 302 and the port 306. In switch 300, the capacitive signal 330 flows from the port 302 through the second transmission line 344 of the coupled transmission line 340 to the port 306. An inductive signal 332 is induced by the signal current via the coupled transmission line 340. The inductive signal 332 cancels at least a portion of the capacitive signal 330 to provide greater isolation for the switching circuit 300. In an embodiment, the switch 300 comprises an ultra-high isolation switch.

Figure 4A:
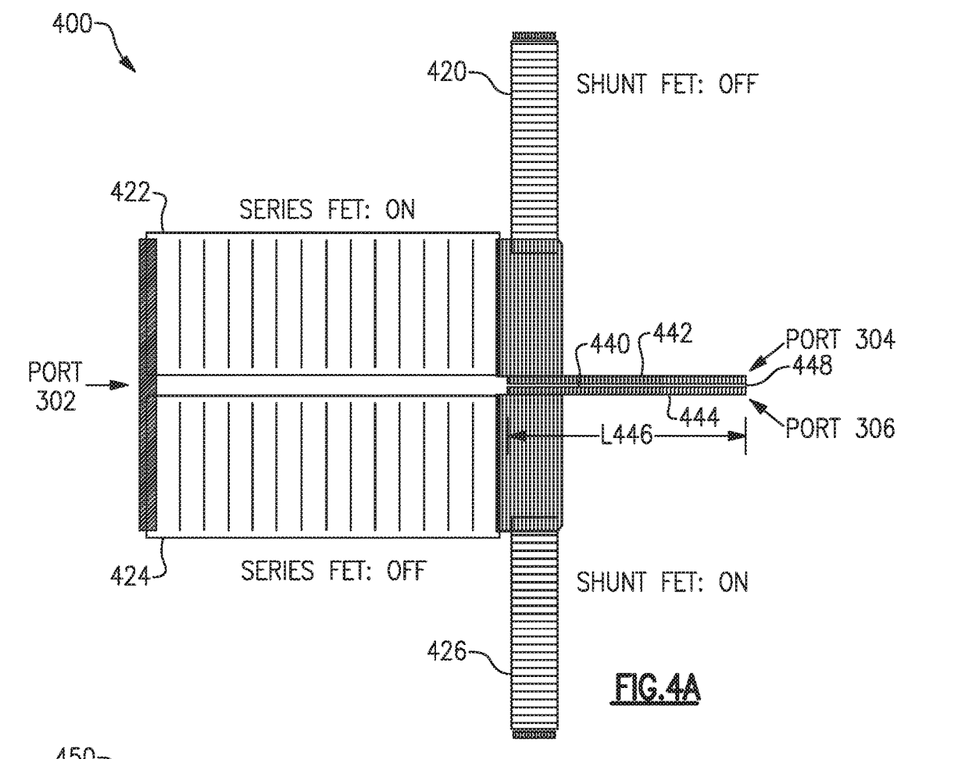
FIG. 4A is a layout schematic of a SPDT switch with a coupled transmission line, according to one embodiment.

FIG. 4A is an embodiment of a layout schematic of a SPDT switch 400. In an embodiment, the SPDT switch 400 comprises the circuit diagram of the SPDT switch 300. The switch 400 comprises a first FET 420, a second FET 422, a third FET 424, and a fourth FET 426, where FETs 422, 424 comprise Series FETs and the FETs 420, 426 comprise Shunt FETs. In an embodiment, the series FETs 422, 424 each comprise 14 transistor devices electrically coupled in series and the shunt FETs 420, 426 each comprise 14 transistor devices electrically coupled in series. In an embodiment, the Series FETs 422, 424 each comprise a 174×23μ×14 FET having a finger number of 174, a unit finger width of approximately 23 microns, and 14 transistor devices electrically coupled in series. In an embodiment, the Shunt FETs 420, 426 each comprise a 54×11.1μ×14 FET having a finger number of 54, a unit finger width of approximately 11.1 microns, and 14 transistor devices electrically coupled in series.

In other embodiments, the Series FETs 422, 424 and/or the Shunt FETs 420, 426 comprise more than or less than 14 transistors in series. In an embodiment, the Series FETs 422, 424 comprise a finger number greater than 174. In an embodiment, the Series FETs 422, 424 comprise a finger number less than 174. In an embodiment, the Series FETs 422, 424 comprise a unit finger width greater than approximately 23 microns. In an embodiment, the Series FETs 422, 424 comprise a unit finger width less than approximately 23 microns. In an embodiment, the Shunt FETs 420, 426 comprise a finger number greater than 54. In an embodiment, the Shunt FETs 420, 426 comprise a finger number less than 54. In an embodiment, the Shunt FETs 420, 426 comprise a unit finger width greater than approximately 11.1 microns. In an embodiment, the Shunt FETs 420, 426 comprise a unit finger width less than approximately 11.1 microns.

The switch 400 further comprises a coupled transmission line 440 comprising a first transmission line 442 and a second transmission line 444. In an embodiment, the coupled transmission line 440 has a length of approximately 270 microns, a width of approximately 10 microns, and a gap between the first transmission line 442 and the second transmission line 444 of approximately 2 microns.

In other embodiments, the length of the coupled transmission line 440 is greater than approximately 270 microns. In an embodiment, the length of the coupled transmission line 440 is less than approximately 270 microns. In an embodiment, the width of the coupled transmission line 440 is greater than approximately 10 microns. In an embodiment, the width of the coupled transmission line 440 is less than approximately 10 microns. In an embodiment, the gap between the first transmission line 442 and the second transmission line 444 is greater than approximately 2 microns. In an embodiment, the gap between the first transmission line 442 and the second transmission line 444 is less than approximately 2 microns.

Figure 4B:
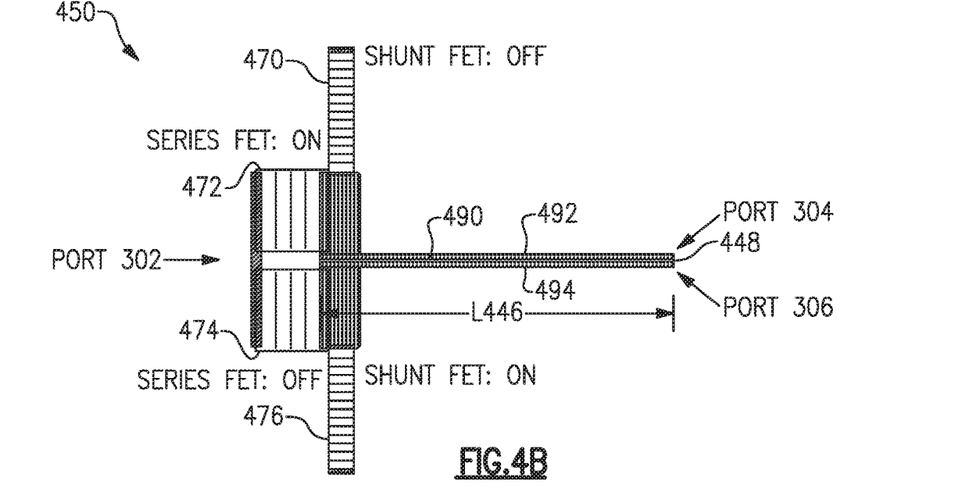
FIG. 4B is a layout schematic of a SPDT switch with a coupled transmission line, according to another embodiment.

FIG. 4B is an embodiment of a layout schematic of a SPDT switch 450. In an embodiment, the SPDT switch 450 comprises the circuit diagram of the switch 300. The switch 450 comprises a first FET 470, a second FET 472, a third FET 474, and a fourth FET 476, where FETs 472, 474 comprise Series FETs and the FETs 470, 476 comprise Shunt FETs. In an embodiment, the Series FETs 472, 474 each comprise four (4) transistor devices electrically coupled in series and the shunt FETs 470, 476 each comprise 14 transistor devices electrically coupled in series.

In other embodiments, the Series FETs 472, 474 comprise more than or less than 4 transistors in series and the Shunt FETs 470 and 476 comprise more than or less than 14 transistors in series.

The switch 450 further comprises a coupled transmission line 490 comprising a first transmission line 492 and a second transmission line 494. Each coupled transmission line 440, 490 has a length 446 and a gap 448. The gap 448 comprises the space on the layout between the individual transmission lines. For example in FIG. 4A, the gap 448 comprises the space on the layout between the individual transmission lines 442, 444 of the coupled transmission line 440. In another example, the gap 448 comprises the space on the layout between the individual transmission lines 492, 494 of the coupled transmission line 490 in FIG. 4B.

Insertion loss can be limited by the number of transistors in series that comprise the FETs. On the other hand, greater numbers of transistors in series leads to improved isolation. FIG. 4B illustrates a reduced number of transistor devices in series for the Series FETs 472, 474, which improves insertion loss for the switch 450 and the addition of the coupled transmission line 490 improves the isolation of the switch 450. Thus, switch 450 has good insertion loss and isolation performance and can use less layout area than switch 400.

In an embodiment, the coupled transmission line 440, 490 comprises a stripline, a microstrip, a coplanar wave guide (CPW), or the like.

Figure 5A:
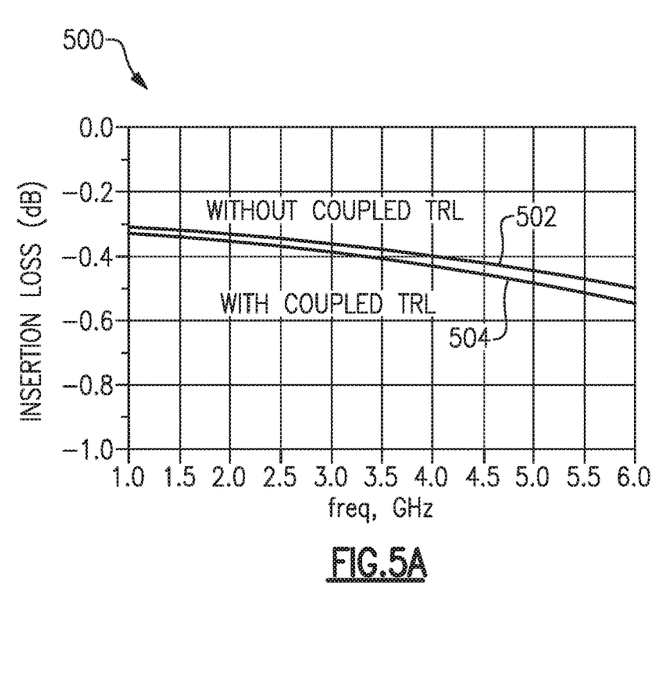
FIG. 5A is an exemplary graph illustrating insertion loss for SPDT switches with and without coupled transmission lines, according to certain embodiments.

FIG. 5A is an exemplary graph 500 illustrating insertion loss versus frequency for embodiments of SPDT switches with and without coupled transmission lines. Insertion loss can be defined as the loss of signal power for signals and is measured in dB, as indicated by the y-axis. The x-axis indicates the frequency of the signal 128 in GHz. Plot 502 represents the insertion loss for signals 128 switched by SPDT switching circuits 100, 200 without coupled transmission lines. Plot 504 represents the insertion loss for signals 128 switched by SPDT switching circuits 300, 400, 450 including the coupled transmission line 340, 440, 490, respectively.

For frequencies between approximately 1 GHz to approximately 6 GHz, the insertion loss 502 is slightly better (higher) for switching circuits 100, 200 without coupled transmission lines than the insertion loss 504 for switching circuits 300, 400, 450 including coupled transmission lines 340, 440, 490, respectively. For example, at approximately 2.0 GHz, the insertion loss for switching circuits 100, 200 is approximately 0.02 dB greater that for switching circuits 300, 400, 450.

Figure 5B:
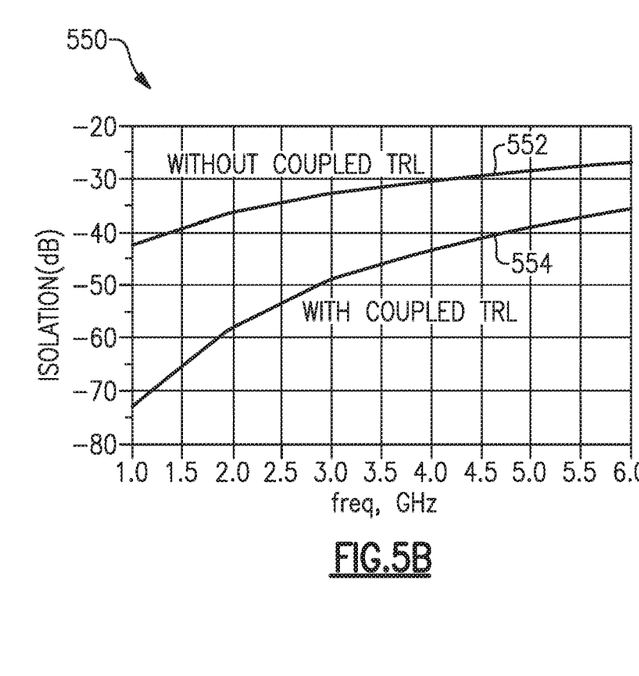
FIG. 5B is an exemplary graph illustrating isolation for SPDT switches with and without coupled transmission lines, according to certain embodiments.

FIG. 5B is an exemplary graph 550 illustrating isolation versus frequency for embodiments of SPDT switches with and without coupled transmission lines. Isolation can be defined as the magnitude of a signal coupled across an open circuit, and is measured in dB, as indicated by the y-axis. The x-axis indicates the frequency of the signal 128 in GHz. Plot 552 represents the insertion loss for signals 128 switched by SPDT switching circuits 100, 200 without a coupled transmission line. Plot 554 represents the insertion loss for signals 128 switched by SPDT switching circuits 300, 400, 450 including the coupled transmission lines 340, 440, 490, respectively.

For frequencies between approximately 1 GHz to approximately 6 GHz, the isolation is much better (lower) for switching circuits 300, 400, 450 including coupled transmission lines 340, 440, 490 than for switching circuits 100, 200 without coupled transmission lines. For example, at approximately 2.0 GHz, the isolation for switching circuits 300, 400, 450 is approximately 21 dB less than for switching circuits 100, 200.

Figure 6:
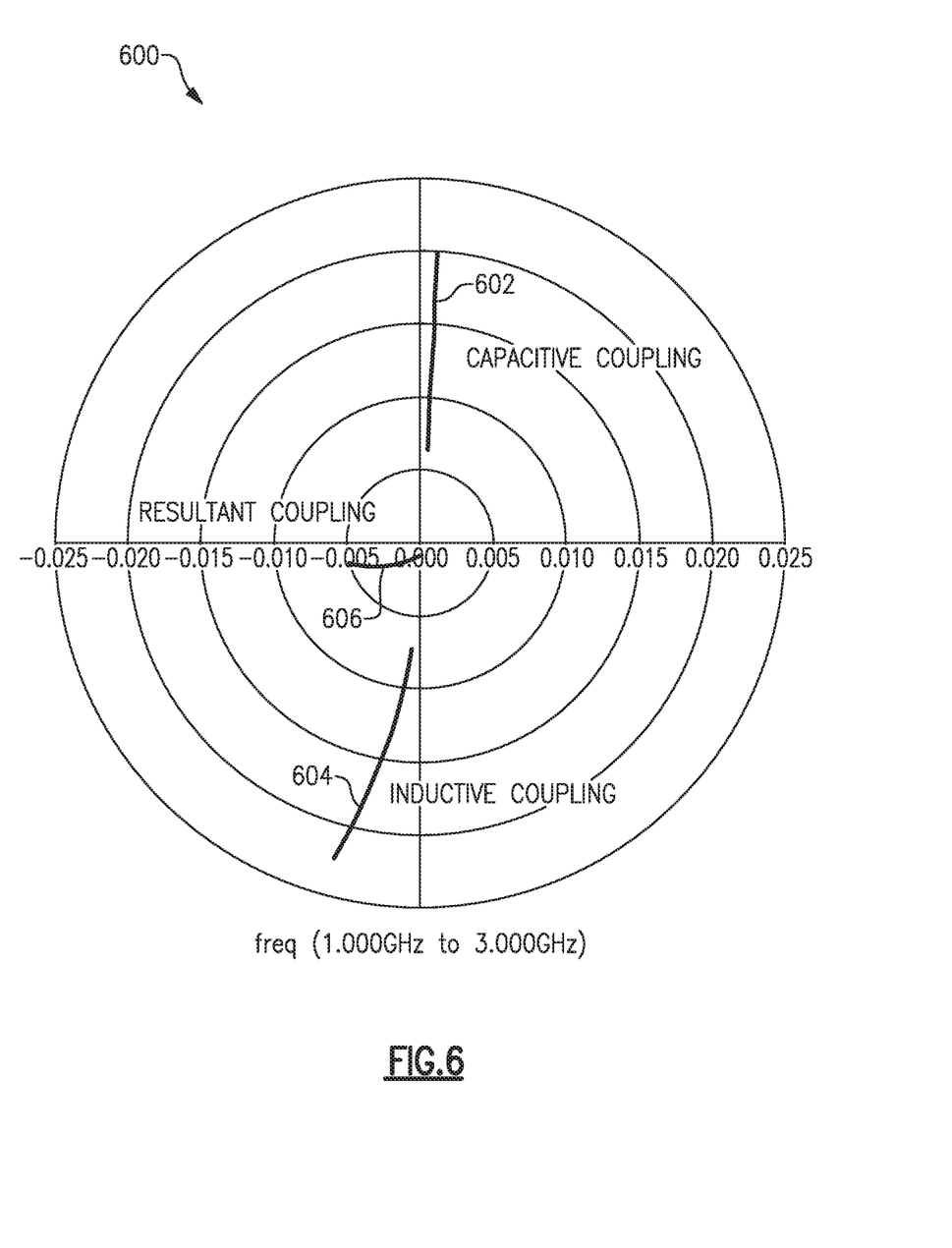
FIG. 6 is an exemplary pole-zero plot illustrating the coupling components of a SPDT switch with a coupled transmission line, according to certain embodiments.

FIG. 6 is an exemplary pole-zero plot 600 illustrating the amplitude and phase of coupling components of the signal 128 switched by an embodiment of the SPDT switch 300, 400, 450 with the coupled transmission line 340, 440, 490, respectively, for signal frequencies between approximately 1.0 GHz and approximately 3.0 GHz. The coupling components comprise a capacitive coupling component 602, an inductive coupling component 604, and a resultant coupling component 606.

In an embodiment, the capacitive coupling component 602 corresponds to the signal 330 and the inductive coupling component 604 corresponds to the signal 332. The capacitive coupling component 602 and the inductive coupling component 604 are comparable in magnitude but approximately opposite in phase. The resultant coupling component 606 comprises the sum of the capacitive coupling component 602 and the inductive coupling component 604. As illustrated in FIG. 6, the inductive coupling component 604 induced by the addition of the coupled transmission line 340, 440, 490 cancels at least a portion of the capacitive coupling component 602. In an embodiment, at least one of the transmission line length 446 and the transmission line gap 448 is varied to create the inductive coupling component 604 that is approximately equal in magnitude to the capacitive coupling component 602 in order to minimize the resultant coupling component 606.

Thus, the resultant coupling component 606 is less than the capacitive coupling component 602 and the inductive coupling component 604, resulting in improved isolation for the switches 300, 400, 450 over that of the switches 100, 200. In an embodiment, the switches 300, 400, 450 comprise ultra-high isolation switches.

Figure 7:
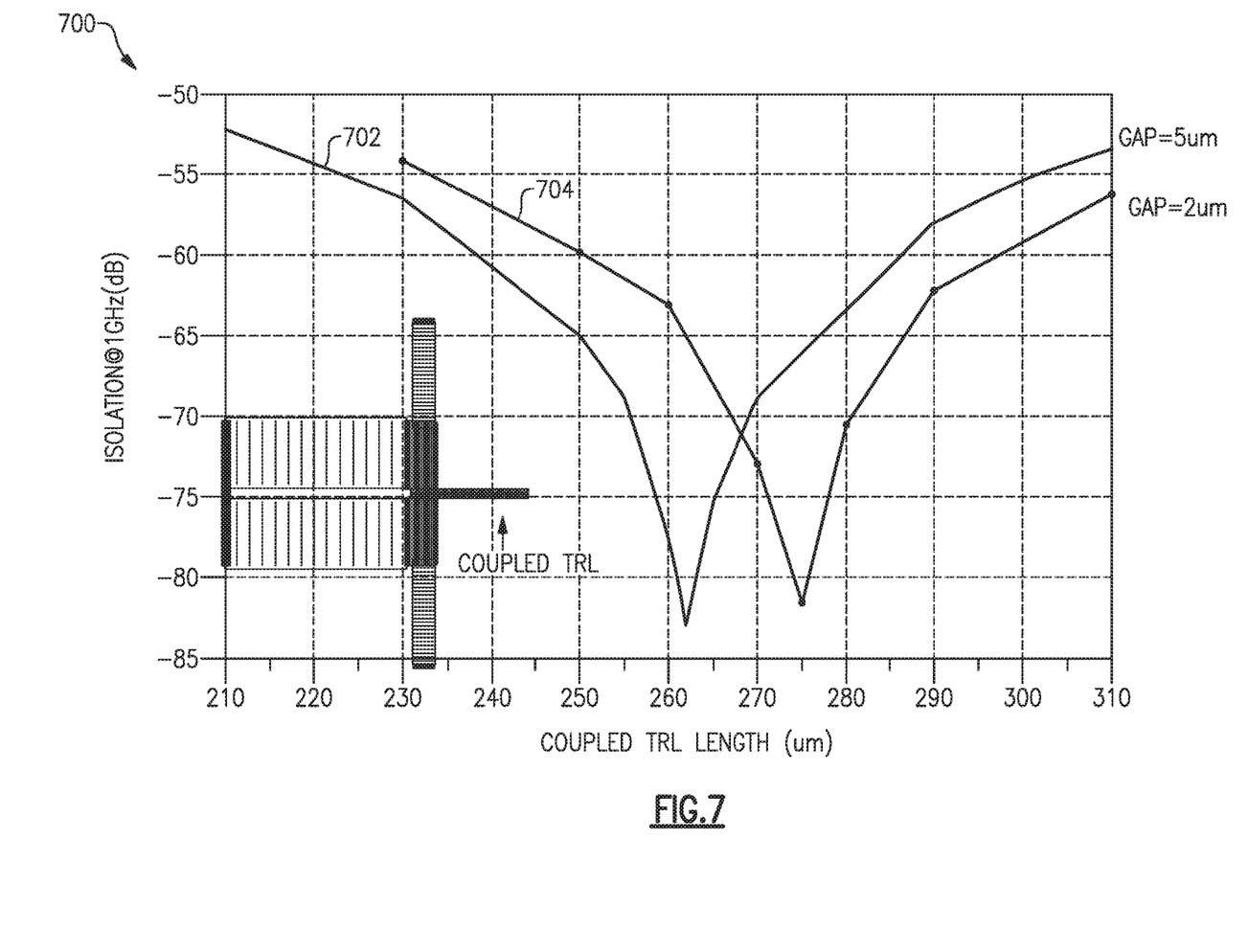
FIG. 7 is an exemplary graph illustrating isolation for embodiments of SPDT switches with a coupled transmission line with differing gaps between the transmission lines, according to certain embodiments.

FIG. 7 is an exemplary graph 700 illustrating the relationship between the transmission line length 446, the transmission line gap 448, and the isolation of the switch 300, 400, 450 for the signal 128 at approximately 1 GHz. The isolation is measured in dB and is indicated by the y-axis. The x-axis indicates the length of the coupled transmission line 340, 440, 490 and is measured in microns. Plot 702 is a plot of the isolation versus transmission line length 446 for an embodiment of the switch 300, 400, 450 having the transmission line gap 448 of approximately 5 microns. Plot 704 is a plot of the isolation versus transmission line length 446 for an embodiment of the switch 300, 400, 450 having the transmission line gap 448 of approximately 2 microns.

The best (minimum) isolation can be achieved by optimizing the transmission line length 446 for a selected transmission line gap. For the embodiment of the switch 300, 400, 450 comprising the approximately 5 micron transmission line gap, the best isolation occurs when the length 446 of the coupled transmission line 340, 440, 490 is approximately 262 microns. For the embodiment of the switch 300, 400, 450 comprising the approximately 2 micron transmission line gap, the best isolation occurs when the length 446 of the coupled transmission line 340, 440, 490 is approximately 275 microns.

Figure 8A:
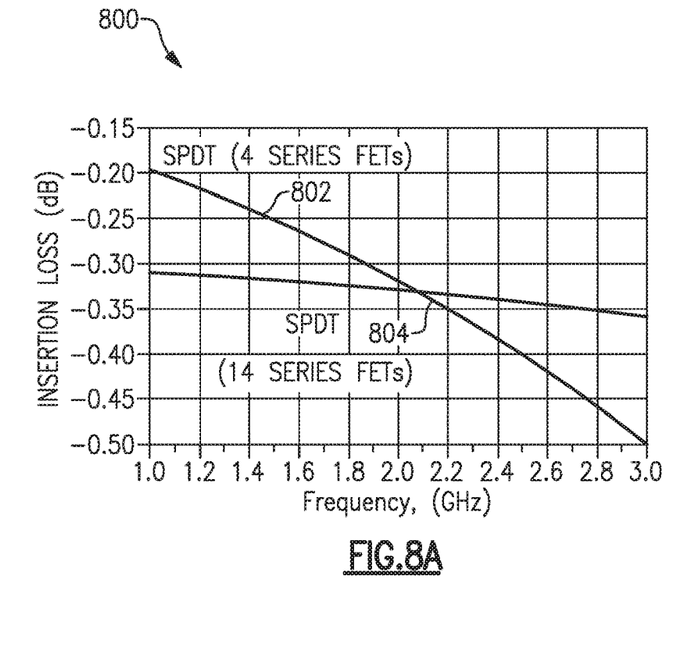
FIG. 8A is an exemplary graph illustrating insertion loss for embodiments of SPDT switches.

FIG. 8A is an exemplary graph 800 illustrating insertion loss for embodiments of the SPDT switch. The insertion loss is measured in dB and indicated on the y-axis. The x-axis indicates the frequency of the signal 128 in GHz. Plot 802 illustrates the insertion loss for the SPDT switch 450 comprising the coupled transmission line 490 and series FETs 472, 474, where each series FET 472, 474 includes four transistor devices electrically coupled in series. Plot 804 illustrates the insertion loss for the SPDT switch 200 without the coupled transmission line and comprising the series FETs 222, 224, where each series FET 222, 224 includes 14 transistor devices electrically coupled in series.

For example, when the signal 128 is approximately 2.1 GHz, the insertion loss of both switches 200, 450 is approximately −0.33 dB. For signals 128 less than approximately 2.1 GHz to approximately 1.0 GHz, the switch 450 shows better insertion loss performance and for signals 128 greater than approximately 2.1 GHz to approximately 3.0 GHz, the switch 200 shows better insertion loss performance.

Figure 8B:
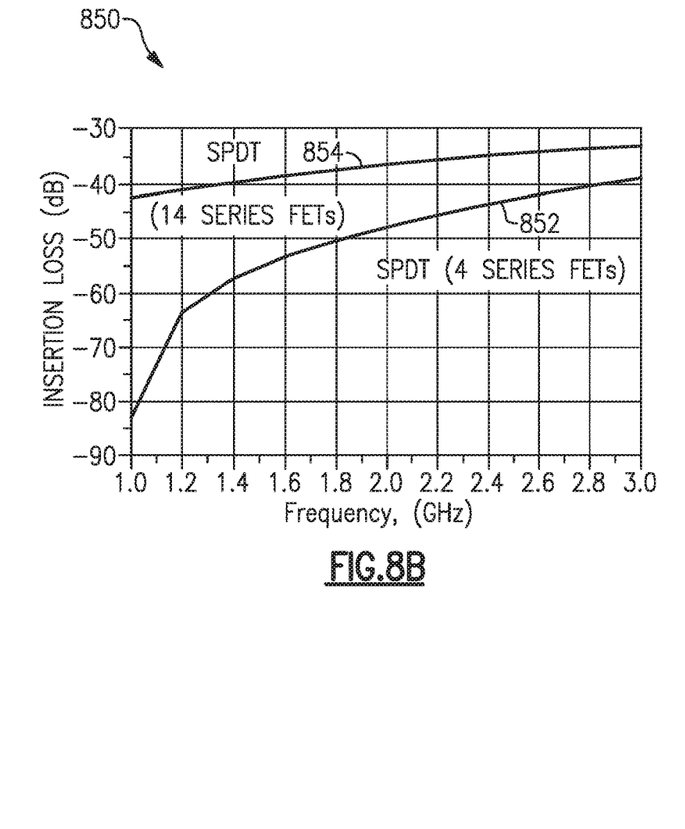
FIG. 8B is an exemplary graph illustrating isolation for embodiments of SPDT switches.

FIG. 8B is an exemplary graph 850 illustrating isolation for embodiments of the SPDT switch. The isolation is measured in dB and is indicated on the y-axis. The x-axis indicates the frequency of the signal 128 in GHz. Plot 852 illustrates the isolation for the SPDT switch 450 comprising the coupled transmission line 490 and series FETs 472, 474, where each series FET 472, 474 includes four transistor devices electrically coupled in series. Plot 854 illustrates the isolation for the SPDT switch 200 without the coupled transmission line and comprising the series FETs 222, 224, where each series FET 222, 224 includes 14 transistor devices electrically coupled in series.

As illustrated in FIG. 8B, the isolation performance of the switch 450 (plot 852) is much better than the isolation performance of the switch 200 (plot 854). For example, at approximately 1 GHz, the isolation of the switch 200 (plot 854) is approximately −43 dB, while the isolation of the switch 450 (plot 852) is approximately −83 dB.

Improvement in both insertion loss and isolation performance can be achieved by optimizing the number of series transistors comprising the Series FETs, the transmission line length 446, and the transmission line gap 448.

Figure 9:
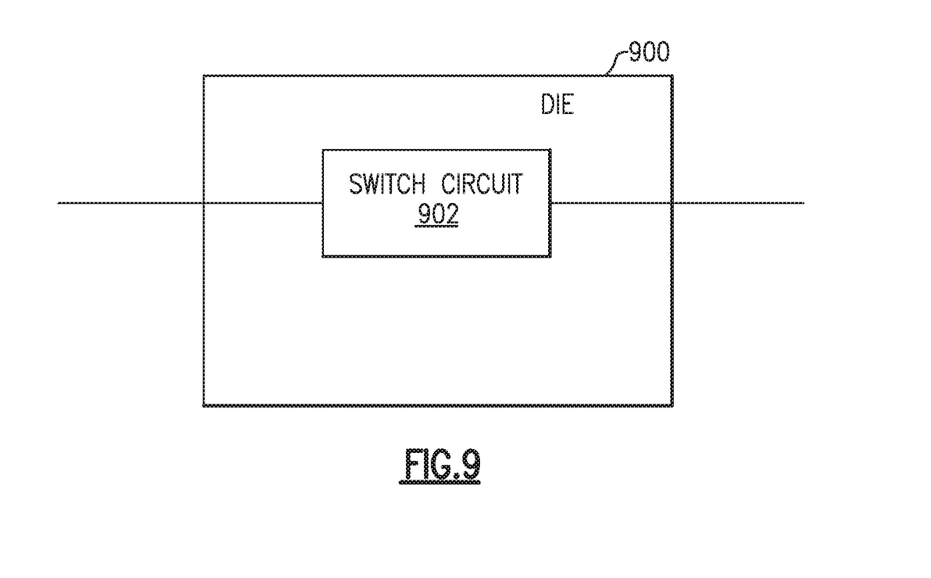
FIG. 9 is an exemplary block diagram of a semiconductor die including an embodiment of a SPDT switching circuit, according to certain embodiments.

FIG. 9 is an exemplary block diagram of a semiconductor die 900 including a switching circuit 902. In one embodiment, the switching circuit 902 comprises the SPDT switch 300, 400, 450. In another embodiment, the switching circuit 902 comprises the SPDT switch 100, 200. In a further embodiment, the switching circuit 902 comprises a switch circuit including at least one pole, at least one throw, and at least one coupled transmission line. In an embodiment, the semiconductor die 900 comprises a silicon (Si) die. In another embodiment, the die 900 can comprise a gallium arsenide (GaAs) die, a pseudomorphic high electron mobility transistor (pHEMT) die, or the like.

Figure 10:
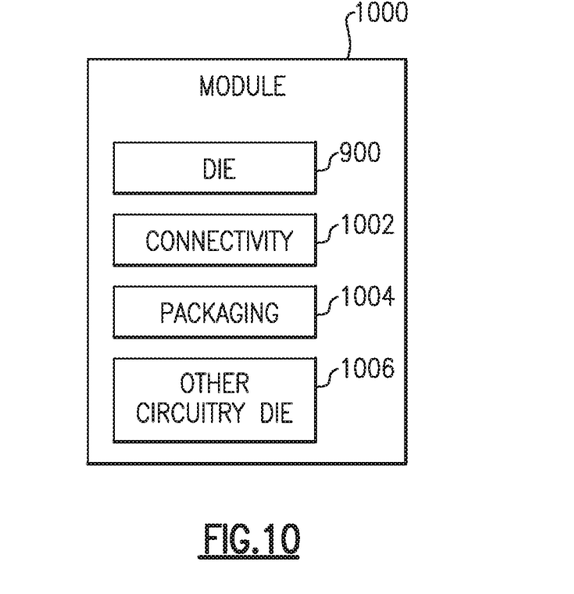
FIG. 10 is an exemplary block diagram of switching module including an embodiment of the semiconductor die of FIG. 9, according to certain embodiments.

FIG. 10 is an exemplary block diagram of switching module 1000 including the semiconductor die 900 of FIG. 9. The module 1000 further includes connectivity 1002 to provide signal interconnections, packaging 1004, such as for example, a package substrate, for packaging of the circuitry, and other circuitry die 1006, such as, for example amplifiers, pre-filters, post filters modulators, demodulators, down converters, and the like, as would be known to one of skill in the art of semiconductor fabrication in view of the disclosure herein.

Figure 11:
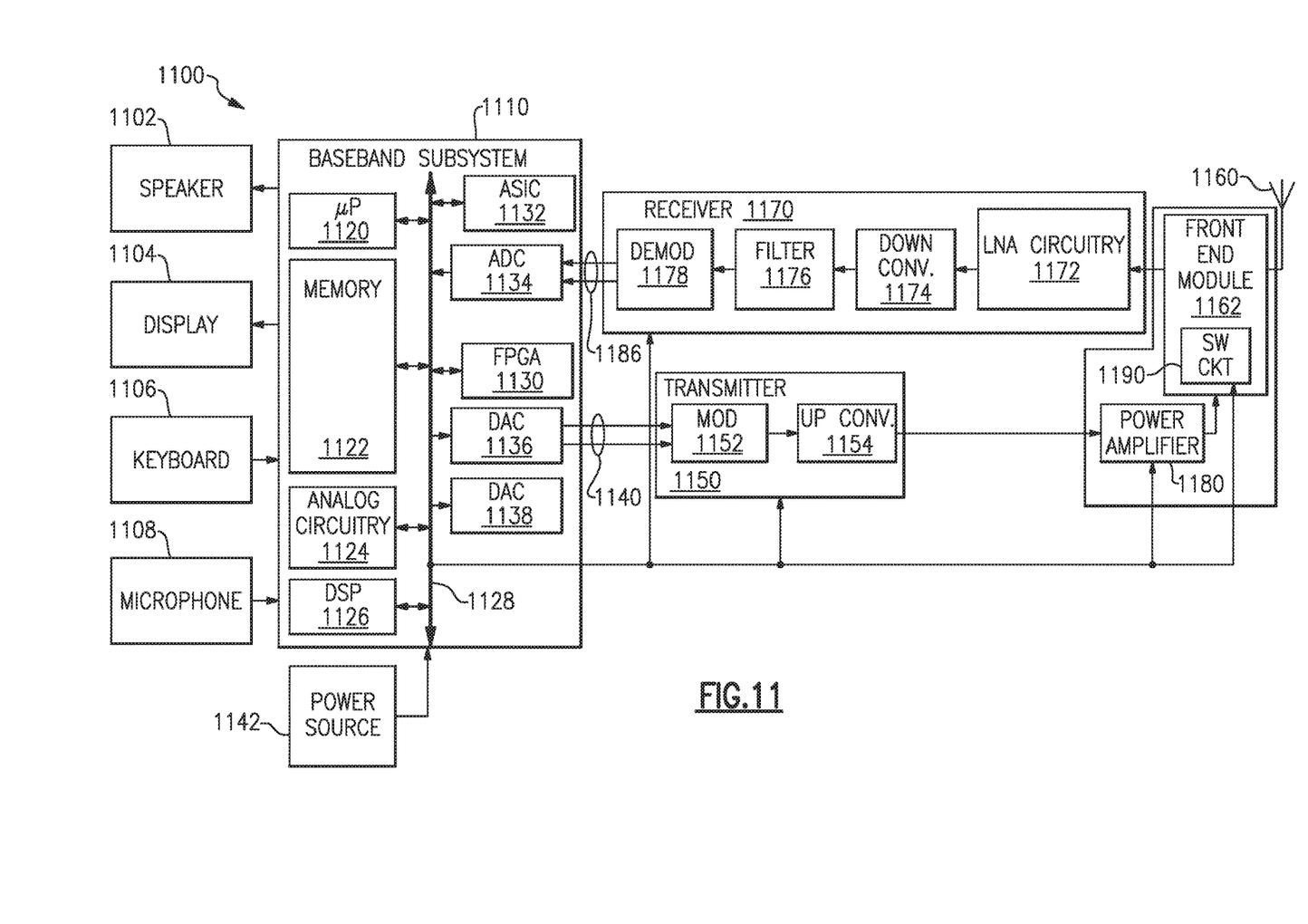
FIG. 11 is an exemplary block diagram illustrating a simplified portable transceiver including an embodiment of an ultra-high isolation SPDT switch, according to certain embodiments.

FIG. 11 is an exemplary block diagram illustrating a simplified portable transceiver 1100 including an embodiment of the very high isolation SPDT switch 300, 400, 450 configured to switch, for example, a signal between the antenna port and the RX and TX ports.

The portable transceiver 1100 includes a speaker 1102, a display 1104, a keyboard 1106, and a microphone 1108, all connected to a baseband subsystem 1110. A power source 1142, which may be a direct current (DC) battery or other power source, is also connected to the baseband subsystem 1110 to provide power to the portable transceiver 1100. In a particular embodiment, portable transceiver 1100 can be, for example, but not limited to a portable telecommunication device, such as a mobile cellular-type telephone. The speaker 1102 and the display 1104 receive signals from baseband subsystem 1110, as known to those skilled in the art. Similarly, the keyboard 1106 and the microphone 1108 supply signals to the baseband subsystem 1110. The baseband subsystem 1110 includes a microprocessor (μP) 1120, memory 1122, analog circuitry 1124, and a digital signal processor (DSP) 1126 in communication via bus 1128. Bus 1128, although shown as a single bus, may be implemented using multiple busses connected as necessary among the subsystems within the baseband subsystem 1110. The baseband subsystem 1110 may also include one or more of an application specific integrated circuit (ASIC) 1132 and a field programmable gate array (FPGA) 1130.

The microprocessor 1120 and memory 1122 provide the signal timing, processing, and storage functions for portable transceiver 1100. The analog circuitry 1124 provides the analog processing functions for the signals within baseband subsystem 1110. The baseband subsystem 1110 provides control signals to a transmitter 1150, a receiver 1170, a power amplifier 1180, and a switching module 1190, for example.

It should be noted that, for simplicity, only the basic components of the portable transceiver 1100 are illustrated herein. The control signals provided by the baseband subsystem 1110 control the various components within the portable transceiver 1100. Further, the function of the transmitter 1150 and the receiver 1170 may be integrated into a transceiver.

The baseband subsystem 1110 also includes an analog-to-digital converter (ADC) 1134 and digital-to-analog converters (DACs) 1136 and 1138. In this example, the DAC 1136 generates in-phase (I) and quadrature-phase (Q) signals 1140 that are applied to a modulator 1152. The ADC 1134, the DAC 1136, and the DAC 1138 also communicate with the microprocessor 1120, the memory 1122, the analog circuitry 1124, and the DSP 1126 via bus 1128. The DAC 1136 converts the digital communication information within baseband subsystem 1110 into an analog signal for transmission to the modulator 1152 via connection 1140. Connection 1140, while shown as two directed arrows, includes the information that is to be transmitted by the transmitter 1150 after conversion from the digital domain to the analog domain.

The transmitter 1150 includes the modulator 1152, which modulates the analog information on connection 1140 and provides a modulated signal to upconverter 1154. The upconverter 1154 transforms the modulated signal to an appropriate transmit frequency and provides the upconverted signal to the power amplifier 1180. The power amplifier 1180 amplifies the signal to an appropriate power level for the system in which the portable transceiver 1100 is designed to operate.

Details of the modulator 1152 and the upconverter 1154 have been omitted, as they will be understood by those skilled in the art. For example, the data on connection 1140 is generally formatted by the baseband subsystem 1110 into in-phase (I) and quadrature (Q) components. The I and Q components may take different forms and be formatted differently depending upon the communication standard being employed.

The power amplifier 1180 supplies the amplified signal to a front-end module 1162. The front-end module 1162 comprises an antenna system interface that may include, for example, the switching module 1190 comprising an embodiment of the switch 300, 400, 450 for switching a signal between the antenna port, the RX port, and the TX port, as described herein to improve the isolation performance of the switch. The transmit signal is supplied from the front-end module 1162 to the antenna 1160.

In an embodiment, the front-end module 1162 comprises the switching module 1190. In an embodiment, switching module 1190 comprises the switching module 1000 including the semiconductor die 900. In these embodiments, the switching circuit in the semiconductor die 900 is an embodiment of the switch 300, 400, 450.

A signal received by antenna 1160 will be directed from the front-end module 1162 to the receiver 1170. The receiver 1170 includes low noise amplifier circuitry 1172, a downconverter 1174, a filter 1176, and a demodulator 1178.

If implemented using a direct conversion receiver (DCR), the downconverter 1174 converts the amplified received signal from an RF level to a baseband level (DC), or a near-baseband level (approximately 100 kHz). Alternatively, the amplified received RF signal may be downconverted to an intermediate frequency (IF) signal, depending on the application. The downconverted signal is sent to the filter 1176. The filter 1176 comprises at least one filter stage to filter the received downconverted signal as known in the art.

The filtered signal is sent from the filter 1176 to the demodulator 1178. The demodulator 1178 recovers the transmitted analog information and supplies a signal representing this information via connection 1186 to the ADC 1134. The ADC 1134 converts these analog signals to a digital signal at baseband frequency and transfers the signal via bus 1128 to the DSP 1126 for further processing.

Other Embodiments

While embodiments have been described with respect to a SPDT switch, the disclosed systems and methods apply to any switch, such as, for example, SPST, DPST, and DPDT switches, switches with more than one pole, switches with more than one throw, and the like, as would be known to one of skill in the art in view of the disclosure herein.

While embodiments have been described with respect to the switch switched so as to electrically connect port 102 to port 104 and disconnect port 102 from port 106, the disclosed systems and methods apply to the switch switched so as to electrically connect port 102 to port 106 and disconnect port 102 from port 104, as would be known to one of skill in the art in view of the disclosure herein.

While embodiments have been described with respect to the signal 128 flowing from port 102 to port 104, the disclosed systems and methods apply to the signal 128 flowing from port 102 to port 106, from port 104 to port 102, or from port 106 to port 102, as would be known to one of skill in the art in view of the disclosure herein.

In an embodiment, such as one needing narrow-band isolation, the switch 300, 400, 450 can be laid out to optimize $R_{on}$ and cancel out at least a portion of the capacitive coupling 330.

In another embodiment, the switch 100, 200 could further comprise an inductor bridging the Series FETs 122, 124; and 222, 224, respectively. The inductor induces an inductive signal to cancel at least a portion of the capacitive signal 330 caused by capacitive coupling between an input port of the switch 100, 200 and an inactive (OFF) output port of the switch 100, 200. Such cross-biasing can improve the insertion loss, isolation, and bandwidth, and the inductor takes up less area on the semiconductor die 900 than the coupled transmission line 340, 440, 490.

In a further embodiment, the switch 300, 400, 450 could further comprise an inductor bridging the Series FETs 322, 324; 422, 424; and 472, 474, respectively, as well as the coupled transmission line 340, 440, 490, respectively, to further improve the isolation of the switching circuit.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize in view of the disclosure herein.

For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. In addition, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching circuit comprising:
    a coupled transmission line including a first transmission line and a second transmission line; and
    a plurality of transistors including first and second transistors electrically connected in series and forming a switch that is configured to switch a signal from a first port to a second port through the first transmission line and to disconnect the first port from a third port, the second transmission line inducing an inductive signal which cancels at least a portion of a capacitive signal generated by the signal capacitively coupling through the switch to the third port, the switch having a common terminal electrically connected to the first port, a first terminal electrically connected to the second port through the first transmission line, and a second terminal electrically connected to the third port through the second transmission line.

2. The switching circuit of claim 1 further comprising a third transistor electrically connected to the first terminal and a fourth transistor electrically connected to the second terminal.

3. The switching circuit of claim 2 wherein the first, second, third, and fourth transistors include field-effect transistors.

4. The switching circuit of claim 1 wherein at least one of the plurality of transistors includes four transistor devices electrically connected in series.

5. The switching circuit of claim 1 wherein the first port is in communication with a radio frequency antenna, the second port is configured to receive a radio frequency receive signal, and the third port is configured to receive a radio frequency transmit signal.

6. The switching circuit of claim 1 wherein the switch includes a single pole double throw switch.

7. A semiconductor die including the switching circuit of claim 1.

8. A portable transceiver including the semiconductor die of claim 7.

9. A switching module including the switching circuit of claim 1.

10. A portable transceiver including the switching circuit of claim 1.

11. The switching circuit of claim 1 wherein the coupled transmission line comprises one of stripline, a microstrip, and a coplanar wave guide.

12. A method to improve isolation of a switching circuit, the method comprising:
    receiving a radio frequency signal at a first port in a switching circuit that includes a switch having first and second transistors electrically connected in series;
    switching the switching circuit so as to electrically connect the first port to a second port in the switching circuit and to electrically disconnect the first port from a third port in the switching circuit, the switch having a common terminal electrically connected to the first port, a first terminal electrically connected to the second port through the first transmission line, and a second terminal electrically connected to the third port through the second transmission line; and
    conducting the radio frequency signal from the first port to the second port through a first transmission line of a coupled transmission line.

13. The method of claim 12 further comprising generating a capacitive signal by capacitive coupling of the radio frequency signal through the switching circuit to the third port.

14. The method of claim 13 further comprising inducing an inductive signal in a second transmission line of the coupled transmission line.

15. The method of claim 14 wherein the inductive signal cancels at least a portion of the capacitive signal to provide isolation improvement.

16. The method of claim 12 wherein the switching circuit includes a single pole double throw switch.

17. The method of claim 16 wherein the single pole double throw switch further includes a third transistor electrically connected to the first terminal and a fourth transistor electrically connected to the second terminal.

18. The method of claim 12 wherein the switching circuit includes a plurality of field-effect transistors.

19. The method of claim 18 wherein at least one of the plurality of field-effect transistors includes four transistor devices electrically connected in series.

20. The method of claim 12 wherein the coupled transmission line comprises one of stripline, a microstrip, and a coplanar wave guide.

* * * * *

UNITED STATES PATENT AND TRADEMARK OFFICE
CERTIFICATE OF CORRECTION

PATENT NO. : 10,263,614 B2
APPLICATION NO. : 15/970527
DATED : April 16, 2019
INVENTOR(S) : Yu Zhu et al.

Page 1 of 1

It is certified that error appears in the above-identified patent and that said Letters Patent is hereby corrected as shown below:

On the Title Page

Item (73), Line 1, under Assignee, change "Solutons," to --Solutions,--.

In the Specification

In Column 5, Line 13, change "$C_{off}$" to --$C_{off}$.--.

In Column 12, Line 46, change "connected"," to --"connected",--.

Signed and Sealed this
Sixteenth Day of July, 2019

Andrei Iancu
*Director of the United States Patent and Trademark Office*